US005486755A

United States Patent [19]
Horan et al.

[11] Patent Number: 5,486,755
[45] Date of Patent: Jan. 23, 1996

[54] ELECTRONIC METER HAVING ANTI-TAMPERING MAGNETIC SHIELD

[75] Inventors: Patrick J. Horan, Dover; Richard A. Balch, North Hampton; David D. Elmore, Somersworth, all of N.H.; Joseph R. Legere, Sanford, Me.

[73] Assignee: General Electric Company, New York, N.Y.

[21] Appl. No.: 364,109

[22] Filed: Dec. 27, 1994

[51] Int. Cl.⁶ .............................. G01R 11/48; G01R 1/20
[52] U.S. Cl. ......................... 324/110; 324/127; 324/142
[58] Field of Search .................................. 324/110, 127, 324/143

[56] References Cited

U.S. PATENT DOCUMENTS 4,413,230  1/1983  Miller .................................. 324/142
4,887,029  12/1989  Hemminger .......................... 324/142

Primary Examiner—Kenneth A. Wieder
Assistant Examiner—Barry C. Bowser
Attorney, Agent, or Firm—Bell Seltzer Park & Gibson

[57] ABSTRACT

An electronic meter for measuring electricity includes a magnetic shield positioned adjacent each outermost toroidal coil of electrical current sensors to thereby resist tampering by a magnetic field applied from outside the meter housing. The magnetic shield has an arcuate cross-sectional shape corresponding to the outermost coil portion and has a predetermined arc length covering only a predetermined portion of the outermost coil portion. The shield preferably has a semicylindrical cross-section shape thereby covering only half the toroidal coil.

20 Claims, 4 Drawing Sheets

ELECTRONIC METER HAVING ANTI-TAMPERING MAGNETIC SHIELD

FIELD OF THE INVENTION

The present invention relates to the field of electric meters and, more particularly, to an electric meter being resistant to tampering.

BACKGROUND OF THE INVENTION

Electric utilities and other providers of electric power have experienced many forms of tampering with conventional electric meters used to measure customer usage of electricity. One form of tampering is accomplished by applying large ferro-magnets to the outside of the meter housing. When this type of magnet is brought within close proximity of an electric meter, the magnetic fields generated by the magnet may interfere with the current sensors mounted within the meter cover. Consequently, the meter may be slowed down allowing the customer to cheat on the electric bill.

Conventional current sensors may also be susceptible to stray electromagnetic fields from other components within the meter housing. Accordingly, shields have been used in electric meters to attempt to protect current sensors from these stray electromagnetic fields. For example, U.S. Pat. No. 4,621,231 to Heinrich et al. and U.S. Pat. No. 5,223,790 to Baran et al. both disclose using conventional shields to protect current sensors from magnetic fields generated by other electrical components. U.S. Pat. No. 4,887,029 to Hemminger also discloses a device for shielding a current sensor from magnetic interferences generated by an adjacent current sensor.

In general, the conventional shields generally encapsulate the component, such as a current sensor, to be protected from magnetic fields. Consequently, these shields typically include multiple parts and are generally bulky. For example, in U.S. Pat. No. 4,413,230 to Miller, each transducer unit is completely surrounded by a shield including an inner and outer assembly. As a result, a significant amount of internal meter space is required to accommodate these shields. In addition, conventional shields may also lead to higher meter manufacturing costs and are not easily added to a meter in the late stages of meter assembly.

Electronic meters are generally smaller in size and have a lower profile than counterpart traditional electro-mechanical meters. Consequently, the smaller size of the newer electronic meters makes it difficult and impractical to use conventional encapsulating shielding. Moreover, improvements in current sensors may obviate the need for shielding from adjacent internal meter components; however, tampering from external magnetic fields is still a concern. Additionally, electronic meters may be easier and more cost effective to manufacture than traditional meters because assembly of the internal components of an electronic meter can be accomplished almost entirely by hand. The conventional encapsulating shields may not facilitate assembly by hand or the addition of shielding at a later stage in the meter assembly process for an electronic meter.

SUMMARY OF THE INVENTION

It is therefore an object of the present invention to provide an electronic meter for measuring electricity including a magnetic shield for preventing tampering from an externally applied magnetic field.

It is another object of the present invention to provide an electronic meter for measuring electricity which includes a magnetic shield which is inexpensive, readily installed, and relatively compact so as to fit within a meter housing.

These and other objects, features and advantages of the present invention are provided by an electronic meter for measuring electricity including a magnetic shield positioned adjacent each outermost toroidal coil of an electrical current sensor to thereby resist tampering by a magnetic field applied from outside the meter housing. The magnetic shield has an arcuate cross-sectional shape corresponding to the outermost coil portion and has a predetermined arc length covering only a predetermined portion of the outermost coil portion.

The meter housing preferably comprises a base and a cover connected to the base. Each of the current sensors preferably includes a toroidal coil defining a coil axis aligned transverse to the base of the housing. The toroidal coils are positioned such that the outermost coils are closely spaced from adjacent the interior surface of the meter housing.

In one embodiment, the predetermined arc length of the magnetic shield defines a semicylindrical shape for the magnetic shield which covers only about half of the toroidal coil, that is about 150° to 180°, and more preferably, 165° to 175°. This amount of shielding is effective in preventing tampering, yet is relatively compact, inexpensive and readily manufactured and installed. The magnetic shield preferably comprises cold-rolled carbon strip steel having a relatively low temper, which does not require an additional annealing step.

Each of the electrical current sensors preferably comprises an electrically conductive plate having an opening in a medial portion thereof defining first and second current branches adjacent respective opposite sides of the opening. Means for generating a voltage between the first and second current branches is provided by an electrical conductor extending through a central opening of the toroidal coil and connecting the first and second current branches. A plastic retainer clip preferably holds the magnetic shield to the plate of the current sensor. The retainer clip preferably has an arcuate cross-sectional shape and an opening in a medial portion thereof to avoid mechanical interferences with the adjacent meter housing or other components.

DETAILED DESCRIPTION OF PREFERRED EMBODIMENTS OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
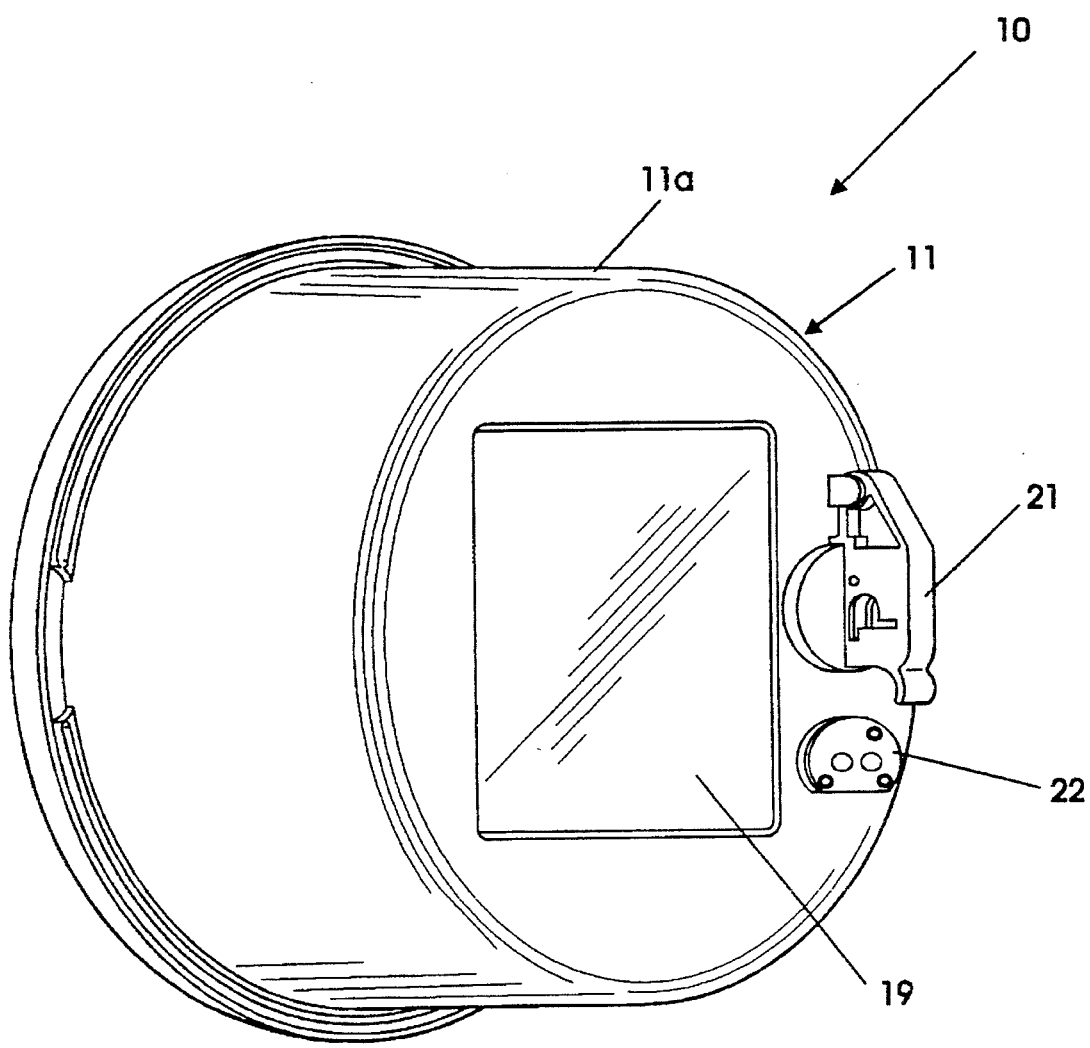
FIG. 1 is a perspective view of an electronic meter according to the present invention.
Figure 2:
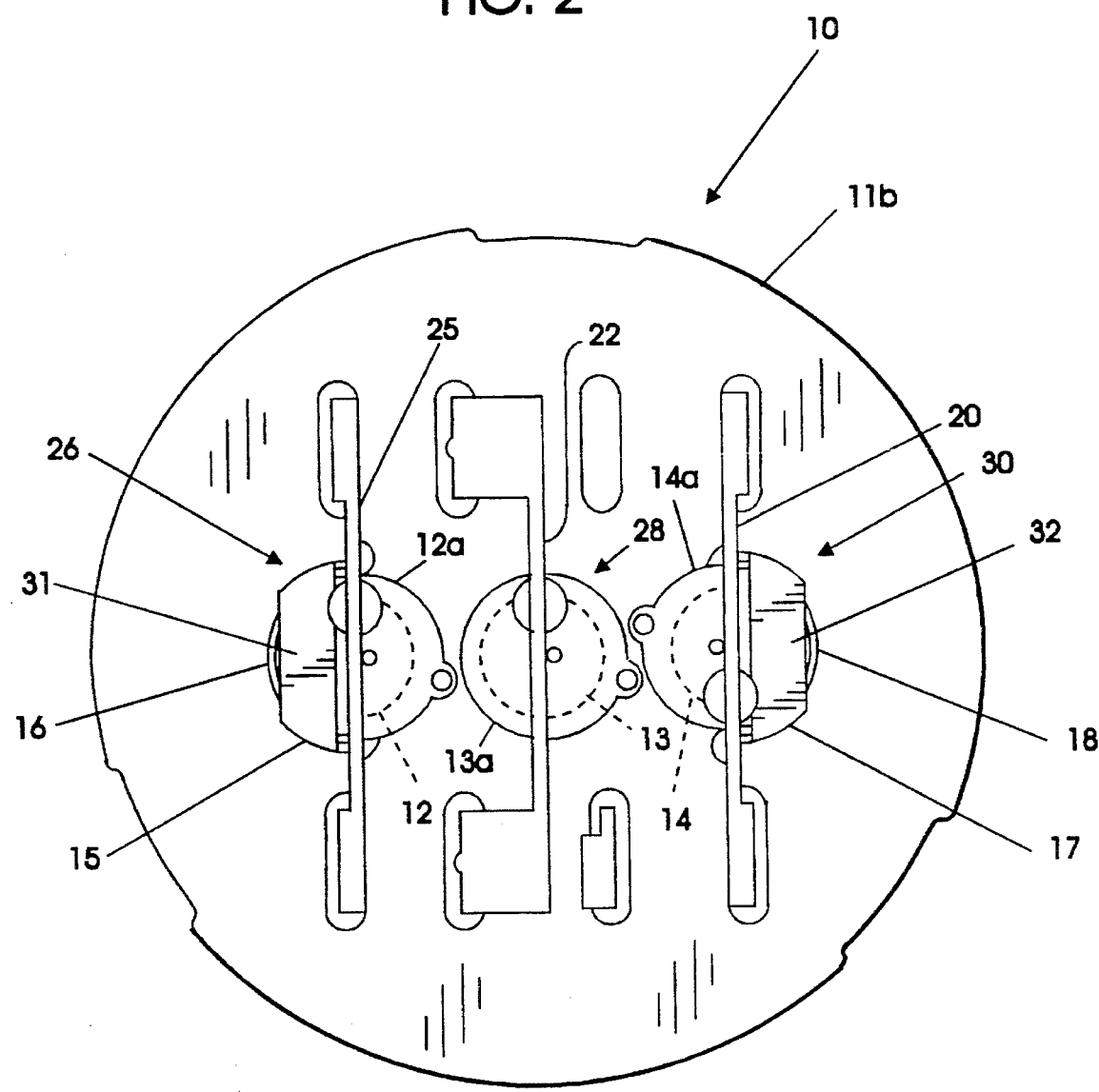
FIG. 2 is a perspective view of the electronic meter shown in FIG. 1 with the cover and a portion of the electronic components removed therefrom for clarity in illustrating the current sensors and magnetic shields according to the invention.

Referring first to FIGS. 1 and 2, the electronic meter 10 for measuring electricity according to the invention is first described. As would be readily understood by those skilled in the art, the meter 10 may measure watthours, varhours, or other quantities. The meter 10 includes a housing 11 defined by a cylindrical cover 11a and a circular base 11b connected to the cover. The housing 11 may have other shapes, such as generally rectangular as would also be readily understood by those skilled in the art.

In the illustrated embodiment, a switch cover 21 is pivotally connected to the outer face of the cover 11a. The switch cover 21 is movable between open and closed positions to permit access to a rotatable plunger switch, such as for resetting the meter 10, and as would be readily understood by those skilled in the art. In addition, a viewing window 19 and an optical reader port 22 are also provided on the outer face of the housing, as would also be readily understood by those skilled in the art.

Referring now additionally to FIGS. 2–5, the illustrated electronic meter 10 includes three electrical current sensors 26, 28 and 30 positioned in side-by-side relation within the housing 11. The positioning of the current sensors 26, 28, 30 in side-by-side relation facilitates their positioning within the housing 11. The three current sensors 26, 28, 30 include respective toroidal coils 12, 13, 14 for measuring electricity. More particularly, the current sensors 26, 28, 30 are positioned so that the axes defined by the toroidal coils 12, 13, 14 are transverse to the meter base 11b. In the illustrated embodiment, the coil axes are orthogonal to the generally planar meter base. The toroidal coils 12, 13, 14, are enclosed within a protective plastic housing 12a, 13a, 14a as illustrated.

The two outermost toroidal coils 12, 14 have outermost coil portions 31, 32 located in closely spaced relation from an adjacent interior portion of the meter housing 11. Because of their locations, the outermost toroidal coils 12, 14 may be susceptible to externally applied magnetic fields, such as may be applied in an attempt to slow or otherwise tamper with the meter 10. Accordingly, the outermost toroidal coils 12, 14 have respective magnetic shields 16, 18 attached thereto for preventing tampering by a magnetic field applied externally to the meter 10.

The interior toroidal coil 13, positioned between the two outermost toroidal coils 12, 14, is considerably less susceptible to tampering by an external magnetic field because of its relatively large separation from a magnetic field that may be applied from external to the housing 11. In particular, a separation of 1.5 to about 1.75 inches may be sufficient to significantly reduce the likelihood of tampering from an externally applied magnetic field. Accordingly, the interior toroidal coil 13 does not need a magnetic shield. Thus, there is more space available within the meter housing 11 for the meter components and/or the meter 10 can be made desirably more compact.

Figure 3:
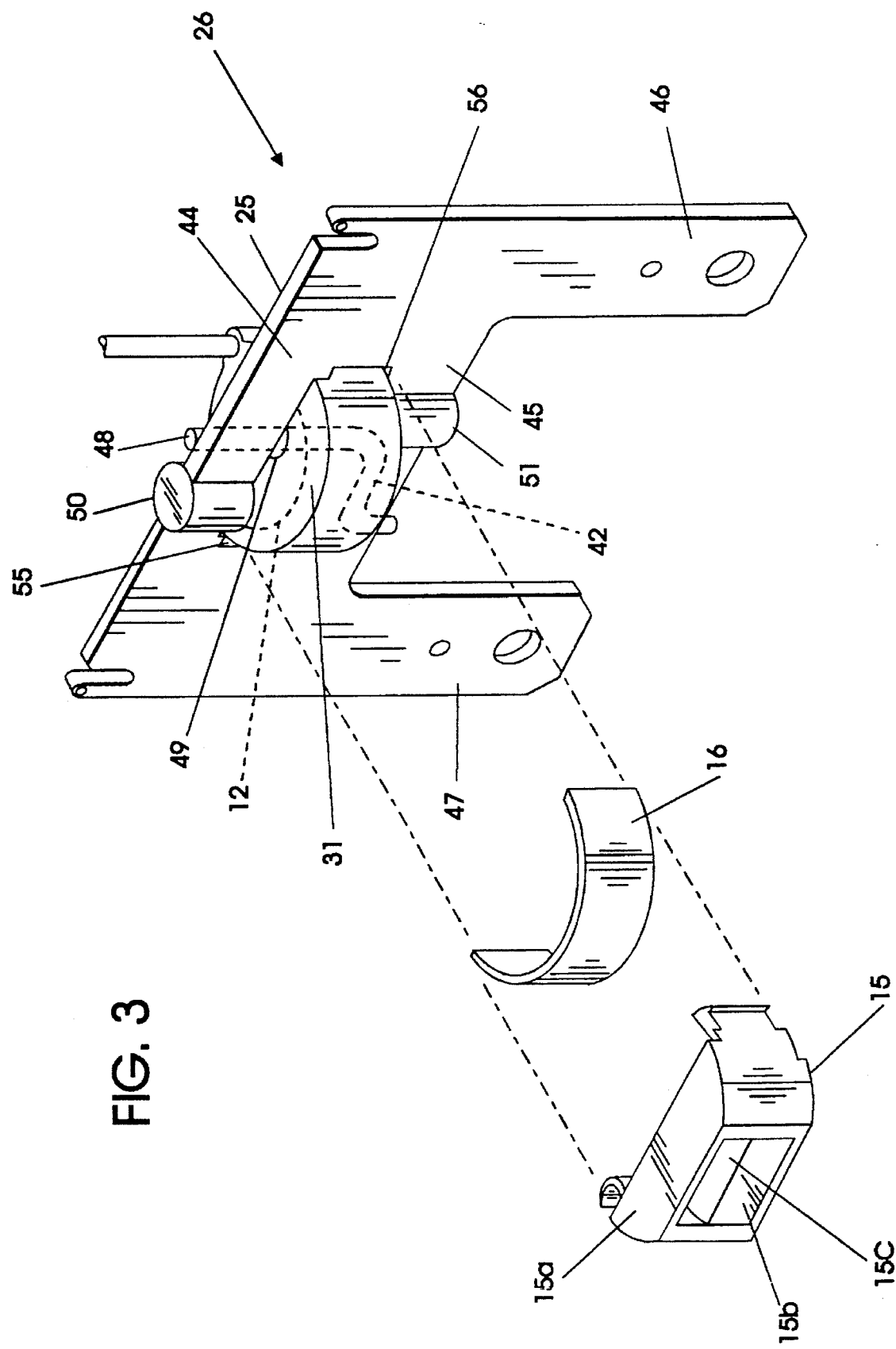
FIG. 3 is an exploded view of a current sensor and magnetic shield shown in FIG. 2.

Referring now more particularly to FIG. 3, the current sensor 26 located on the left side of the meter base 11b as shown in FIG. 2 will be described more fully; however, it will be understood by those skilled in the art that all three current sensors include similar elements. The electrical current sensor 26 preferably comprises an electrically conductive plate 25 having an opening 42 in a medial portion thereof defining a first current branch 44 and a second current branch 45 adjacent the medial opening 42. The conductive plate 25 has first and second legs 46, 47 which extend outwardly from the meter base 11b to provide electrical terminals for connection within a meter socket, not shown, as would be readily understood by those skilled in the art.

The diagonally positioned cylindrical resistive elements 50, 51 located in the respective first and second current branches 44, 45 create a voltage between the two branches. An electrical conductor 48 is connected between the two branches 44, 45 and passes through a central opening 49 of the toroidal coil 12 to thereby develop a magnetic field in the toroidal coil proportional to the current flowing through the plate 25.

The magnetic shield 16 is positioned overlying the outer coil portion 31 of the current sensor 26 and maintained in place by a plastic retainer clip 15 secured at the opposite ends of the opening 42 in the conductive plate 25. Thus, the retainer clip 15 and the magnetic shield 16 may be readily installed even relatively late in the meter assembly process. Accordingly, a magnetic shield 16 can be selectively added to a meter 10.

The magnetic shield 16 has an arcuate shape corresponding to the outermost coil portion 31 of the toroidal coil 12. In the illustrated embodiment, the arc length of the magnetic shield 16 defines a semicylindrical shape for the magnetic shield which covers only about half of the toroidal coil 12. More particularly, the shield 16 covers about 150° to 180°, and, more preferably, 165° to 175°. This amount of shielding is effective in preventing tampering by a magnetic field while using a relatively small amount of material. Moreover, the shield 16 may be readily installed onto the conductive plate 25 of the current sensor 26.

The magnetic shield 16 is preferably made from magnetically soft, dead soft, commercial quality, cold-rolled steel of relatively low temper having a thickness in a range of about 0.040 to 0.045 inches. This type of steel is preferred because of its ability to shield the toroidal coil windings, and because the material requires no annealing after shaping. No exotic, and therefore expensive, magnetic material is required. The retainer clip 15 is preferably made from a heat stabilized Black Nylon® type 6/12 which is selected for good moisture resistance and stability under load at high temperature. As would be readily understood by those skilled in the art, other plastic materials may be used for the retainer clip 15.

Figure 4:
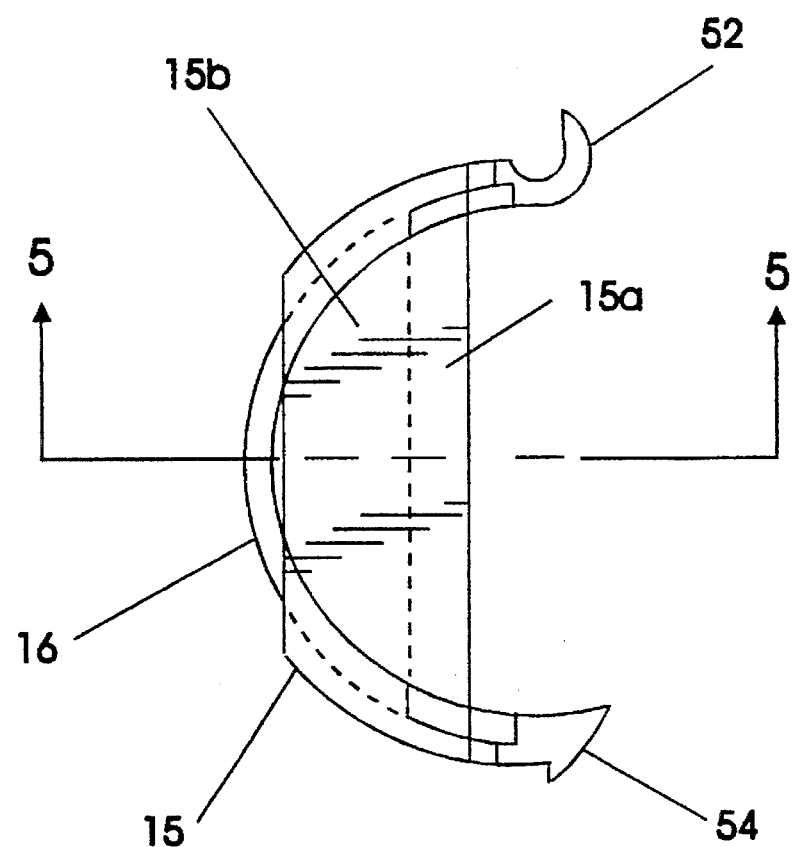
FIG. 4 is a greatly enlarged plan view of the assembled magnetic shield and shield holder according to the invention.
Figure 5:
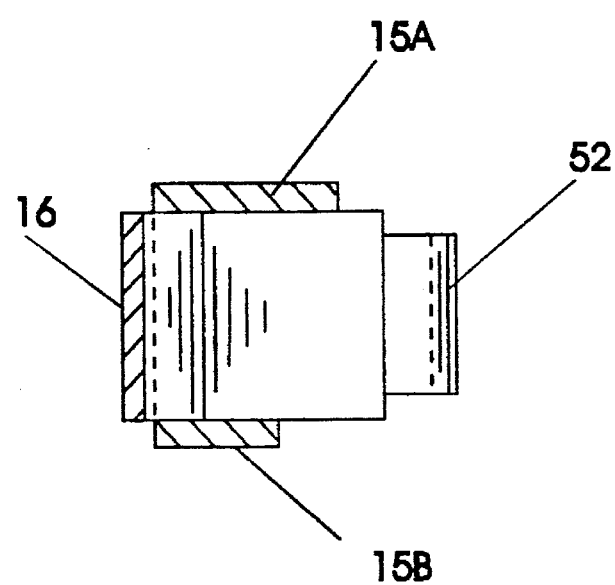
FIG. 5 is a cross-sectional view of the assembled magnetic shield and shield holder taken along lines 5—5 in FIG. 4.

Referring to FIGS. 4 and 5, the retainer clip 15 preferably has an arcuate cross-sectional shape matching the arcuate shape of the magnetic shield 16 so that the outer surface of the magnetic shield fits securely and generally in contact with the interior surface of the retainer clip 15. The retainer clip 15 has an opening 15c in the medial portion 27 thereof to reduce mechanical interference with the meter housing 11a or other internal meter parts. The clip 15 also includes an integrally molded upper cross member 15a and a lower cross member 15b.

The retainer clip 15 has a first hook portion 52 defining a hinge with a corresponding edge of the conductive plate 25, and a tab portion 54 for securing the retainer clip to an adjacent opposite edge portion of the electrically conductive plate. In other terms, the magnetic shield 16 may be installed by first positioning the shield within the retainer clip 15 and then engaging the first hook portion 52 into a corresponding end portion 55 of the opening 42. The clip 15 may then be pivoted to engage the opposite tab portion 54 into a corresponding end portion 56 of the opening 42. Assembly and installation is thus relatively quick and may be completed by hand without any special tools.

The retainer clip 17 and magnetic shield 18 of the right outermost current sensor 30 (FIG. 2) is similar to that for the left sensor as described above, and, hence, needs no further description. In addition, in another embodiment of the electronic meter according to the invention, the arcuate magnetic shield may be incorporated within the plastic housing surrounding outermost coil portions of the outermost current sensors.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An electronic meter for measuring electricity and being resistant to tampering by an externally applied magnetic field, said electronic meter comprising:

a housing comprising a base and a cover connected thereto;

a plurality of electrical current sensors positioned within said housing, each of said electrical current sensors comprising a toroidal coil defining a coil axis aligned transverse to the base, outermost ones of said toroidal coils having respective outermost coil portions positioned in closely spaced relation from an adjacent interior surface of said housing; and a magnetic shield positioned adjacent each outermost toroidal coil to thereby resist tampering by a magnetic field applied from external to said housing, said magnetic shield having an arcuate cross-sectional shape corresponding to the outermost coil portion and having a predetermined arc length covering only a predetermined portion of the outermost coil portion.

2. An electronic meter according to claim 1 wherein the predetermined arc length of said magnetic shield defines a semicylindrical shape for said magnetic shield and covers the outermost coil portion in a range of about 150° to 180°.

3. An electronic meter according to claim 1 wherein said magnetic shield comprises cold-rolled carbon strip steel having a relatively low temper.

4. An electronic meter according to claim 1 wherein each of said electrical current sensors comprises:

an electrically conductive plate having an opening in a medial portion thereof defining first and second current branches adjacent respective opposite sides of the opening; and means for generating a voltage between the first and second current branches and comprising an electrical conductor extending between the first and second current branches and through a central opening of said toroidal coil.

5. An electronic meter according to claim 4 further comprising a retainer clip surrounding said magnetic shield and having first and second end portions engaging said electrically conductive plate at the opening thereof for securing said magnetic shield to said current sensor.

6. An electronic meter according to claim 5 wherein said retainer clip has an arcuate cross-sectional shape and an opening in a medial portion thereof.

7. An electronic meter according to claim 4 wherein each of said current sensors comprises first and second electrical terminals extending outwardly from said base and electrically connected to said electrically conductive plate.

8. An electronic meter according to claim 4 wherein said plurality of electrical current sensors are arranged in side-by-side relation.

9. An electronic meter for measuring electricity and being resistant to tampering by an externally applied magnetic field, said electronic meter comprising:

a housing comprising a base and a cover connected thereto;

at least three electrical current sensors positioned within said housing arranged in side-by-side relation, each of said electrical current sensors comprising a toroidal coil defining a coil axis aligned transverse to said base, outermost ones of said toroidal coils having respective outermost coil portions positioned in closely spaced relation from an adjacent interior surface of said housing; and a magnetic shield positioned adjacent only each outermost toroidal coil to thereby resist tampering by a magnetic field applied from external to said housing, said magnetic shield having an arcuate cross-sectional shape corresponding to the outermost coil portion and having a predetermined arc length covering only a predetermined portion of the outermost coil portion.

10. An electronic meter according to claim 9 wherein the predetermined arc length of said magnetic shield defines a semicylindrical shape for said magnetic shield and covers the outermost coil portion in a range of about 150° to 180°.

11. An electronic meter according to claim 9 wherein said magnetic shield comprises cold-rolled carbon strip steel having a relatively low temper.

12. An electronic meter according to claim 9 wherein each of said electrical current sensors comprises:

an electrically conductive plate having an opening in a medial portion thereof defining first and second current branches adjacent respective opposite sides of the opening; and means for generating a voltage between the first and second current branches and comprising an electrical conductor extending between the first and second current branches and through a central opening of said toroidal coil.

13. An electronic meter according to claim 12 further comprising a retainer clip surrounding said magnetic shield and having first and second end portions engaging said electrically conductive plate at the opening thereof for securing said magnetic shield to said current sensor.

14. An electronic meter according to claim 13 wherein said retainer clip has an arcuate cross-sectional shape and an opening in a medial portion thereof.

15. An electronic meter according to claim 13 wherein each of said current sensors comprises first and second electrical terminals extending outwardly from said base and electrically connected to said electrically conductive plate.

16. An electronic meter for measuring electricity and being resistant to tampering by an externally applied magnetic field, said electronic meter comprising:

a housing comprising a base and a cover connected thereto;

a plurality of electrical current sensors positioned within said housing, each of said electrical current sensors comprising a toroidal coil defining a coil axis aligned transverse to said base, outermost ones of said toroidal coils having respective outermost coil portions positioned in closely spaced relation from an adjacent interior surface of said housing; and a magnetic shield positioned adjacent each outermost toroidal coil to thereby resist tampering by a magnetic field applied from external to said housing, said magnetic shield comprising cold-rolled carbon strip steel having a relatively low temper, said magnetic shield having a semicylindrical cross-sectional shape corresponding to the outermost coil portion and having an arc length covering the outermost coil portion in a range of about 150° to 180°.

17. An electronic meter according to claim 16 wherein each of said electrical current sensors comprises:

an electrically conductive plate having an opening in a medial portion thereof defining first and second current branches adjacent respective opposite sides of the opening; and means for generating a voltage between the first and second current branches and comprising an electrical conductor extending between the first and second current branches and through a central opening of said toroidal coil.

18. An electronic meter according to claim 17 further comprising a retainer clip surrounding said magnetic shield and having first and second end portions engaging said electrically conductive plate at the opening thereof for securing said magnetic shield to said current sensor.

19. An electronic meter according to claim 16 wherein said housing comprises a base and a cover connected thereto, and wherein each of said current sensors comprises first and second electrical terminals extending outwardly from said base and electrically connected to said electrically conductive plate.

20. An electronic meter according to claim 16 wherein said plurality of electrical current sensors are arranged in side-by-side relation.

\* \* \* \* \*